(12) United States Patent
Park et al.

(10) Patent No.: US 10,547,040 B2
(45) Date of Patent: Jan. 28, 2020

(54) ENERGY STORAGE DEVICE HAVING AN INTERLAYER BETWEEN ELECTRODE AND ELECTROLYTE LAYER

(71) Applicant: Applied Materials, Inc., Santa Clara, CA (US)

(72) Inventors: Giback Park, San Jose, CA (US); Byung-Sung Kwak, Portland, OR (US); Lizhong Sun, San Jose, CA (US); Dimitrios Argyris, Los Altos, CA (US); Kyuil Cho, Santa Clara, CA (US); Miaojun Wang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 300 days.

(21) Appl. No.: 15/339,187

(22) Filed: Oct. 31, 2016

(65) Prior Publication Data
US 2017/0301957 A1    Oct. 19, 2017

Related U.S. Application Data (60) Provisional application No. 62/322,415, filed on Apr. 14, 2016.

(51) Int. Cl.
*H01M 10/0585* (2010.01)
*H01M 2/08* (2006.01)
(Continued)

(52) U.S. Cl.
CPC ....... *H01M 2/1094* (2013.01); *B23K 26/0006* (2013.01); *B23K 26/142* (2015.10);
(Continued)

(58) Field of Classification Search
CPC ......... H01M 10/0585; H01M 10/0436; H01M 10/0525; H01M 2/08; H01M 2/0207; H01M 2220/30
See application file for complete search history.

(56) References Cited

U.S. PATENT DOCUMENTS

| 5,266,769 A | 11/1993 | Deshpande et al. |
| 5,359,176 A | 10/1994 | Balliet, Jr. et al. |

(Continued)

FOREIGN PATENT DOCUMENTS

| CN | 104134816 A | 11/2014 | |
| JP | 2004-127743 | * 4/2004 | ............ H01M 10/36 |

(Continued)

OTHER PUBLICATIONS

International Search Report and Written Opinion dated Jul. 20, 2017 for PCT/US2017/027537 filed Apr. 14, 2017.

*Primary Examiner* — Osei K Amponsah (57) ABSTRACT

Approaches herein provide a device, such as a battery protection device, including a cathode current collector and an anode current collector provided atop a substrate, a cathode provided atop the cathode current collector, and an electrolyte layer provided over the cathode. An interlayer, such as one or more layers of silicon, antimony, magnesium, titanium, magnesium lithium, and/or silver lithium, is formed over the electrolyte layer. An anode contact layer, such as an anode or anode current collector, is then provided over the interlayer. By providing the interlayer atop the electrolyte layer prior to anode contact layer deposition, lithium from the cathode side alloys with the interlayer, thus providing a more isotropic or uniaxial detachment of the anode contact layer.

10 Claims, 6 Drawing Sheets

(51) Int. Cl.

| | | |
|---|---|---|
| *H01M 2/02* | (2006.01) | |
| *H01M 10/04* | (2006.01) | |
| *H01M 10/0525* | (2010.01) | |
| *H01M 2/10* | (2006.01) | |
| *H01M 4/38* | (2006.01) | |
| *H01M 4/525* | (2010.01) | |
| *B23K 26/142* | (2014.01) | |
| *B23K 26/00* | (2014.01) | |
| *B23K 26/362* | (2014.01) | |
| *B29C 59/16* | (2006.01) | |
| *H01M 6/00* | (2006.01) | |
| *H01M 6/18* | (2006.01) | |
| *H01M 6/40* | (2006.01) | |
| *C23C 14/34* | (2006.01) | |
| *C23C 14/50* | (2006.01) | |
| *H01J 37/32* | (2006.01) | |
| *H01J 37/34* | (2006.01) | |
| *B23K 101/34* | (2006.01) | |
| *B23K 101/36* | (2006.01) | |
| *B23K 103/16* | (2006.01) | |
| *B29L 31/34* | (2006.01) | |

(52) U.S. Cl.
CPC ............ *B23K 26/362* (2013.01); *B29C 59/16* (2013.01); *C23C 14/34* (2013.01); *C23C 14/50* (2013.01); *H01J 37/32715* (2013.01); *H01J 37/3426* (2013.01); *H01M 2/026* (2013.01); *H01M 2/0207* (2013.01); *H01M 2/0267* (2013.01); *H01M 2/0287* (2013.01); *H01M 2/08* (2013.01); *H01M 4/382* (2013.01); *H01M 4/525* (2013.01); *H01M 6/005* (2013.01); *H01M 6/18* (2013.01); *H01M 6/188* (2013.01); *H01M 6/40* (2013.01); *H01M 10/0436* (2013.01); *H01M 10/0525* (2013.01); *H01M 10/0585* (2013.01); *B23K 2101/34* (2018.08); *B23K 2101/36* (2018.08); *B23K 2103/172* (2018.08); *B29K 2995/0006* (2013.01); *B29L 2031/3468* (2013.01); *H01M 2220/30* (2013.01); *H01M 2300/0065* (2013.01); *H01M 2300/0068* (2013.01)

(56) References Cited

U.S. PATENT DOCUMENTS

| | | | |
|---|---|---|---|
| 5,681,666 A | | 10/1997 | Treger et al. |
| 5,868,847 A | | 2/1999 | Chen et al. |
| 5,922,133 A | | 7/1999 | Tepman et al. |
| 6,120,607 A | | 9/2000 | Taravade |
| 6,168,884 B1 | * | 1/2001 | Neudecker .......... H01M 4/0447 429/104 |
| 6,566,628 B2 | | 5/2003 | Vogt et al. |
| 6,994,933 B1 | | 2/2006 | Bates |
| 7,204,862 B1 | | 4/2007 | Zhang |
| 7,298,017 B1 | | 11/2007 | Liu et al. |
| 2003/0044682 A1 | * | 3/2003 | Park ................... C22C 13/00 429/223 |
| 2003/0062126 A1 | | 4/2003 | Scaggs |
| 2003/0118897 A1 | | 6/2003 | Mino et al. |
| 2003/0127435 A1 | | 7/2003 | Voutsas |
| 2004/0029311 A1 | | 2/2004 | Snyder et al. |
| 2004/0096745 A1 | | 5/2004 | Shibano et al. |
| 2004/0224501 A1 | | 11/2004 | Lo |
| 2007/0048604 A1 | | 3/2007 | Gaillard et al. |
| 2007/0125638 A1 | | 6/2007 | Zhang et al. |
| 2007/0258076 A1 | | 11/2007 | Maria Derksen et al. |
| 2007/0281247 A1 | | 12/2007 | Phillips et al. |
| 2008/0003492 A1 | | 1/2008 | Bates |
| 2008/0003493 A1 | | 1/2008 | Bates |
| 2008/0032236 A1 | | 2/2008 | Wallace et al. |
| 2008/0213664 A1 | | 9/2008 | Krasnov et al. |
| 2009/0181303 A1 | | 7/2009 | Neudecker et al. |
| 2009/0278277 A1 | | 11/2009 | Gong et al. |
| 2009/0304931 A1 | | 12/2009 | Uenosono |
| 2010/0140078 A1 | | 6/2010 | Pinarbasi |
| 2011/0031655 A1 | | 2/2011 | Toth et al. |
| 2011/0045351 A1 | | 2/2011 | Peled et al. |
| 2011/0076550 A1 | | 3/2011 | Liang et al. |
| 2011/0076568 A1 | | 3/2011 | Bouillon |
| 2011/0097625 A1 | | 4/2011 | Bedjaoui et al. |
| 2012/0214047 A1 | | 8/2012 | Kwak et al. |
| 2012/0214064 A1 | | 8/2012 | Sabi |
| 2012/0318664 A1 | | 12/2012 | Jiang et al. |
| 2012/0321815 A1 | | 12/2012 | Song et al. |
| 2013/0128488 A1 | | 5/2013 | Forster et al. |
| 2014/0007418 A1 | | 1/2014 | Song et al. |
| 2014/0030618 A1 | | 1/2014 | Kim et al. |
| 2014/0038028 A1 | | 2/2014 | Genard |
| 2014/0265915 A1 | | 9/2014 | Huang et al. |
| 2014/0272541 A1 | | 9/2014 | Huang et al. |
| 2014/0363610 A1 | | 12/2014 | Sameoto |
| 2015/0036302 A1 | | 2/2015 | Tai et al. |
| 2015/0047767 A1 | | 2/2015 | Sano |
| 2015/0125752 A1 | | 5/2015 | Nishimura et al. |
| 2015/0325862 A1 | | 11/2015 | Song et al. |
| 2015/0372350 A1 | | 12/2015 | Solomon et al. |
| 2016/0049624 A1 | | 2/2016 | Bhardwaj et al. |
| 2016/0088756 A1 | | 3/2016 | Ramadas |
| 2016/0336552 A1 | | 11/2016 | MacLean et al. |

FOREIGN PATENT DOCUMENTS

| | | | | |
|---|---|---|---|---|
| JP | 2010017732 A | | 1/2010 | |
| JP | 2013-062133 | * | 4/2013 | ........ H01M 10/0585 |
| KR | 20120013665 A | | 2/2012 | |
| KR | 101346317 B1 | | 12/2013 | |
| WO | WO0173873 A1 | | 10/2001 | |
| WO | 2014099974 A1 | | 6/2014 | |
| WO | 2015112986 A1 | | 7/2015 | |
| WO | 2016033379 A1 | | 3/2016 | |
| WO | 2016037109 A1 | | 3/2016 | |
| WO | WO2016033453 A1 | | 3/2016 | |

* cited by examiner

ENERGY STORAGE DEVICE HAVING AN INTERLAYER BETWEEN ELECTRODE AND ELECTROLYTE LAYER

RELATED APPLICATIONS

This Application claims priority to U.S. provisional patent application 62/322,415, filed Apr. 14, 2016, entitled "Volume Change Accommodating TFE Materials," and incorporated by reference herein in its entirety.

FIELD OF THE DISCLOSURE

The present embodiments relate to solid state energy storage devices and, more particularly, to an energy storage device having an interlayer between electrode and electrolyte layers.

BACKGROUND OF THE DISCLOSURE

Solid state batteries, such as thin film batteries, are being rapidly developed for many applications. The energy density and specific energy of a battery, corresponding to the energy capacity of the battery per unit volume and weight, respectively, are notable performance measures. Generally, solid state and thin film batteries can provide higher energy density and specific energy than liquid containing batteries. In small sizes, solid state batteries are often fabricated by microelectronic processing techniques, and may be used in applications such as for example, portable electronics, medical devices, and space systems. In larger sizes, the batteries can be used to power electric cars or store electrical power in a home or electrical grid.

In general, solid state batteries may be formed by creating a reservoir of the charge carrier, such as lithium (Li), on the anode side of the device by depositing metallic Li. In other cases, this reservoir of charge carriers is not created separately, as the device relies on the charge carriers already in the cathode. In such cases, the Li anode layer may be replaced with a metallic layer to provide the anode area to complete the electrochemical devices layout. Some of the materials may include transition metals, such as Cu, and alloy materials, capable of forming an intricate interface with the electrolyte layer below.

Certain problems are observed with conventional solid state batteries formed minus a separately deposited anode/negative electrode layer. For example, the de-intercalated Li from the cathode side (e.g., $LiCoO_2$) may press the structure anisotropically at the electrolyte-anode/Cu interface, leading to stress induced breaking/cracking of the metal anode layer as the volume of Li detaches the Cu from the interface. Such cracking can lead to a direct path of oxidants, leading to loss of limited charge carriers, and thus, the battery capacity. The stress results from the fact the Li from the cathode side does not intercalate or readily alloy with the anode material or the non-Li metallic anode (current collector). Other consequences of this cracking are an increase in overall device impedance from the increased electrical and electrochemical contact resistances (not continuous interface), as well as the impedance from the reacted/oxidized charge carriers (e.g., in the form of $LiOH$, $Li_2CO_3$, etc.), leading to device performance degradation. As such, interface engineering is necessary with conventional devices.

SUMMARY OF THE DISCLOSURE

In view of the foregoing, approaches herein provide an interlayer separating anode and electrolyte layers of a thin film device. The interlayer may be formed atop an electrolyte layer, and is formed from one or more layers of silicon, antimony, aluminum, magnesium, titanium, magnesium lithium, and/or silver lithium. By providing such interlayer atop the electrolyte layer prior to anode or anode current collector layer deposition, lithium from the cathode side can alloy with the interlayer, thus providing a more isotropic or uniaxial detachment of the anode or anode current collector as Li plates onto the anode or anode current collector side during initial charging of the device.

An exemplary device in accordance with the present disclosure may include a cathode current collector provided atop a substrate, a cathode provided atop the cathode current collector, an electrolyte layer provided over the cathode, an interlayer provided over the electrolyte layer, and an anode contact layer provided over the interlayer.

An exemplary thin film device in accordance with the present disclosure may include a cathode current collector and a first anode current collector formed atop a substrate, a cathode formed atop the cathode current collector, an electrolyte layer formed over the cathode, an interlayer formed over the electrolyte layer, and at least one of an anode or a second anode current collector formed directly atop the interlayer.

An exemplary method for forming a device in accordance with the present disclosure may include forming a cathode current collector and a first anode current collector atop a substrate, forming a cathode atop the cathode current collector, forming an electrolyte layer over the cathode, forming an interlayer over the electrolyte layer; and forming an anode contact layer atop the interlayer.

BRIEF DESCRIPTION OF THE DRAWINGS

The accompanying drawings illustrate exemplary approaches of the disclosed embodiments so far devised for the practical application of the principles thereof, and wherein.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

One or more approaches in accordance with the present disclosure will now be described more fully hereinafter with reference to the accompanying drawings, where embodiments of devices and methods are shown. The approaches may be embodied in many different forms and are not to be construed as being limited to the embodiments set forth herein. Instead, these embodiments are provided so this disclosure will be thorough and complete, and will fully convey the scope of the devices and methods to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of an energy storage device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As further described herein, approaches of the disclosure provide a device, such as a battery protection device, including a cathode current collector and an anode current collector formed atop a substrate, a cathode formed atop the cathode current collector, and an electrolyte layer formed over the cathode. An interlayer, such as one or more layers of silicon, antimony, aluminum, magnesium, titanium, magnesium lithium, and/or silver lithium, is provided over the electrolyte layer. An anode contact layer, such as an anode and/or an anode current collector, is then provided over the interlayer. By providing the interlayer atop the electrolyte layer prior to metallic anode contact layer deposition, Li from the cathode side alloys with the interlayer, thus providing a more isotropic or uniaxial detachment of the metallic anode.

As used herein, the term cathode is intended to represent a positive electrode, and the term anode is used to represent a negative electrode. A person of ordinary skill will appreciate, depending on whether the device is charging or discharging, the positive electrode may be a cathode (e.g., in the case of a reduction and electron gain) or the positive electrode may be an anode (e.g., in the case of oxidation and electron loss). Similarly, the negative electrode may be a cathode or an anode depending on the state of the device.

Figure 1A:
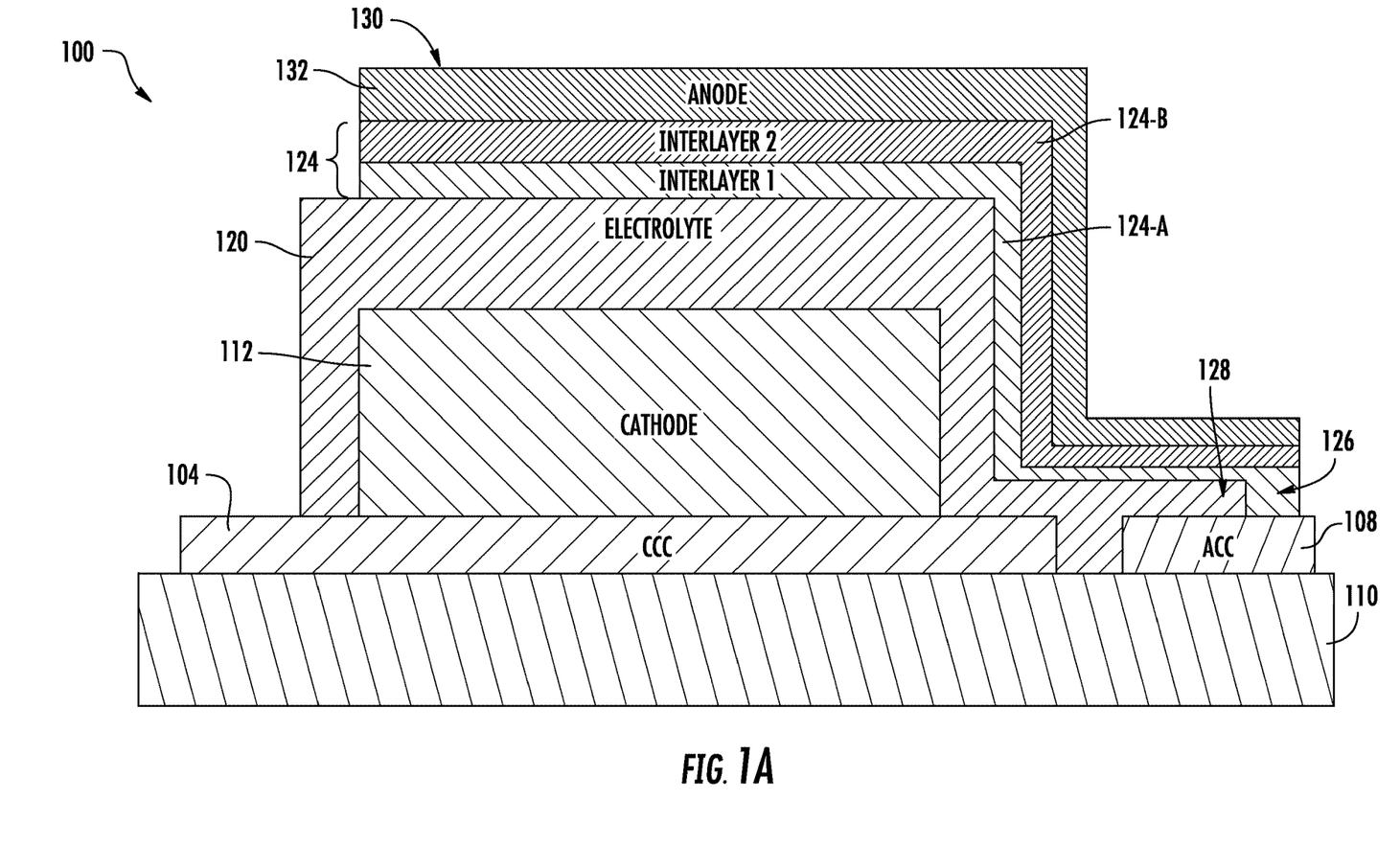
FIG. 1A depicts a side cross-sectional view of a device in accordance with exemplary embodiments of the present disclosure.
Figure 1B:
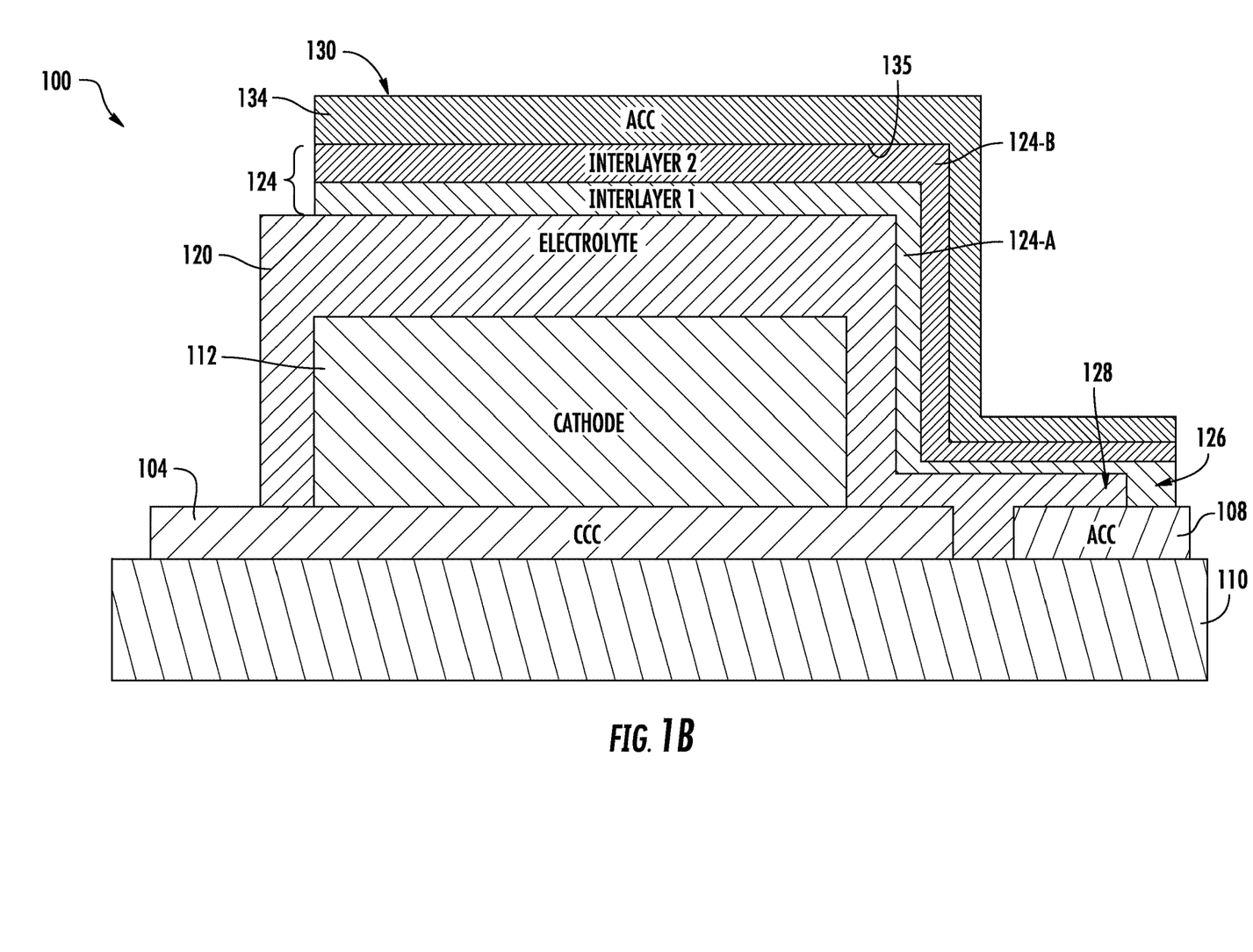
FIG. 1B depicts a side cross-sectional view of a device in accordance with exemplary embodiments of the present disclosure.

Turning now to FIGS. 1A-B, cross-sectional views of a device 100, such as a solid-state device (e.g., a thin film battery) according to various embodiments of the disclosure will be described in greater detail. As shown, the device 100 includes a cathode current collector 104 and an anode current collector 108 formed atop a substrate 110. A cathode 112 (e.g., a positive electrode) may be provided atop the cathode current collector 104, and an electrolyte layer 120 may be provided over the cathode 112. An interlayer 124, such as one or more layers of silicon, antimony, aluminum, magnesium, titanium, magnesium lithium, and/or silver lithium, may be provided over the electrolyte layer 120. An anode contact layer 130 is then provided over the interlayer 124. In the embodiment shown, the anode contact layer 130 may include an anode 132, characterized as an electrochemically active layer. The thin films of each layer of the device 100 may be formed by thin film fabrication processes, such as, for example, physical or chemical vapor deposition methods (PVD or CVD), oxidation, nitridation or electroplating.

In some embodiments, the substrate 110 of the device 100 serves as a support for the battery and is made from a material suitably impermeable to environmental elements. The substrate may have a relatively smooth processing surface upon for forming thin films thereupon, and also has adequate mechanical strength to support the deposited thin films at fabrication temperatures and at battery operational temperatures. For example, the substrate 110 may be an insulator, semiconductor, or a conductor, depending upon the intended electrical properties of the exterior surfaces. More specifically, the substrate 110 may be made from a ceramic, metal or glass, such as, for example, Yttrium stabilized zirconium oxide, aluminum oxide, silicate glass, or even aluminum or steel, depending on the application. In one embodiment, the substrate 110 comprises mica including a layered silicate having a muscovite structure, and a stoichiometry of $KAl_3Si_3O_{10}(OH)_2$. Mica has a six-sided planar monoclinic crystalline structure with good cleavage properties along the direction of the large planar surfaces. Because of the crystal structure of mica, the substrate 110 may be split into thin foils along its basal lateral cleavage planes to provide thin substrates having surfaces smoother than most chemically or mechanically polished surfaces.

In some embodiments, the device 100 includes a plurality of current collectors positioned on opposing sides of the electrolyte layer 120. More specifically, as shown in FIG. 1B, the anode contact layer 130 may include an anode current collector 134 having a surface 135 where Li, for example, coming from the cathode side with charging, "plates" to form the anode/negative electrode in a configuration where the anode contact layer 130 does not include a separately deposited anode. As a result, the interlayer 124 alloying with this Li allows smoother plating and alloying to maintain the integrity of the anode current collector 134. In some embodiments, a separately formed electrochemically active layer, such as the anode 132 shown in FIG. 1A, is not present in the anode contact layer 130 of FIG. 1B because the anode current collector 134 serves as the anode current collector and the anode itself. For example, just the anode current collector 134 may be provided over the interlayer 124, as the anode is formed during a first charge cycle of the cell under the anode current collector 134. In exemplary embodiments, the anode current collector 134 may include a non-reactive metal such as silver, gold, platinum or aluminum, and/or titanium, wherein titanium serves as an adhesion layer for the platinum and gold.

As shown, the electrolyte layer 120 is provided between the anode contact layer 130 and the cathode 112. In some embodiments, the electrolyte layer 120 may be, for example, an amorphous lithium phosphorus oxynitride film, referred to as a LiPON film. In one non-limiting embodiment, the LiPON film is of the form $Li_xPO_yN_z$ having a thickness between approximately 0.1 microns to approximately 5 microns. The electrolyte thickness is suitably large to provide adequate protection from shorting of the cathode 112 and the anode contact layer 130, and suitably small to reduce ionic pathways to minimize electrical resistance and reduce stress.

In some embodiments, the cathode 112 may include an electrochemically active material, such as amorphous vanadium pentoxide $V_2O_5$, or one of several crystalline compounds, such as $TiS_2$, $LiMnO_2$, $LiMn_2O_2$, $LiMn_2O_4$, $LiCoO_2$ and $LiNiO_2$. In one non-limiting embodiment, the anode contact layer 130 is made from Li and the cathode 112 is made from $LiCoO_2$. A suitable thickness for the anode contact layer 130 or cathode 112 may be from approximately 0.1 microns to approximately 50 microns.

The anode current collector 108 and the cathode current collector 104 provide a conducting surface for electron dissipation or collection from the electrodes. The anode current collector 108 and the cathode current collector 104 are shaped and sized to increase electron conductivity to or from the electrodes, and are formed over or below the electrodes, to electrically couple to the same. The anode current collector 108 and the cathode current collector 104 may be conductive layers including metal-containing materials, such as, for example, metal, non-reactive metal, metal alloy, metal silicide, conductive metal oxides, or mixtures thereof.

In one non-limiting embodiment, the anode current collector 108 and the cathode current collector 104 each include a non-reactive metal such as silver, gold, platinum or aluminum. These materials allow the device 100 to be processed at relatively high temperatures after forming the anode current collector 108 and the cathode current collector 104, yet minus the material of the anode current collector 108 and the cathode current collector 104 reacting with other component films of the device 100. The anode current collector 108 and the cathode current collector 104 may have a thickness selected to provide a suitable electrical conductivity. For example, in one embodiment, the anode current collector 108 and the cathode current collector 104 may have thicknesses of from approximately 0.05 microns to approximately 5 microns. In another embodiment, the anode current collector 108 is made from copper and the cathode current collector 104 is made from platinum.

Although not shown, the device 100 may also include one or more adhesion layers deposited on the substrate 110 or the surfaces of any of the other layers of the device 100, to improve adhesion of overlying layers. The adhesion layer may comprise a metal such as, for example, titanium, cobalt, aluminum, or other metals. In some non-limiting embodiments, the adhesion layer may be AlOx or SiNx.

In exemplary embodiments, the interlayer 124 is provided over the electrolyte layer 120, and below the anode contact layer 130, and generally conforms to the shape of the electrolyte layer 120. A section 126 of the interlayer 124 extends beyond an edge 128 of electrolyte layer 120, and directly connects with the anode current collector 108. In some embodiments, the interlayer 124 may include "Interlayer 1" 124-A and one or more additional interlayers, for example shown as "Interlayer 2" 124-B. The materials of interlayers 124A-B include Si, Sb, Al, Mg, or Ti, as well as alloy materials such as MgLi and AgLi. By providing the interlayer 124 atop the electrolyte layer 120 prior to deposition of the metallic anode contact layer 130, lithium from the cathode 112 alloys with the materials of the interlayer 124 to provide a more isotropic or uniaxial detachment of the metallic anode contact layer 130, thus reducing cracking or void formation at the interface.

Figure 2:
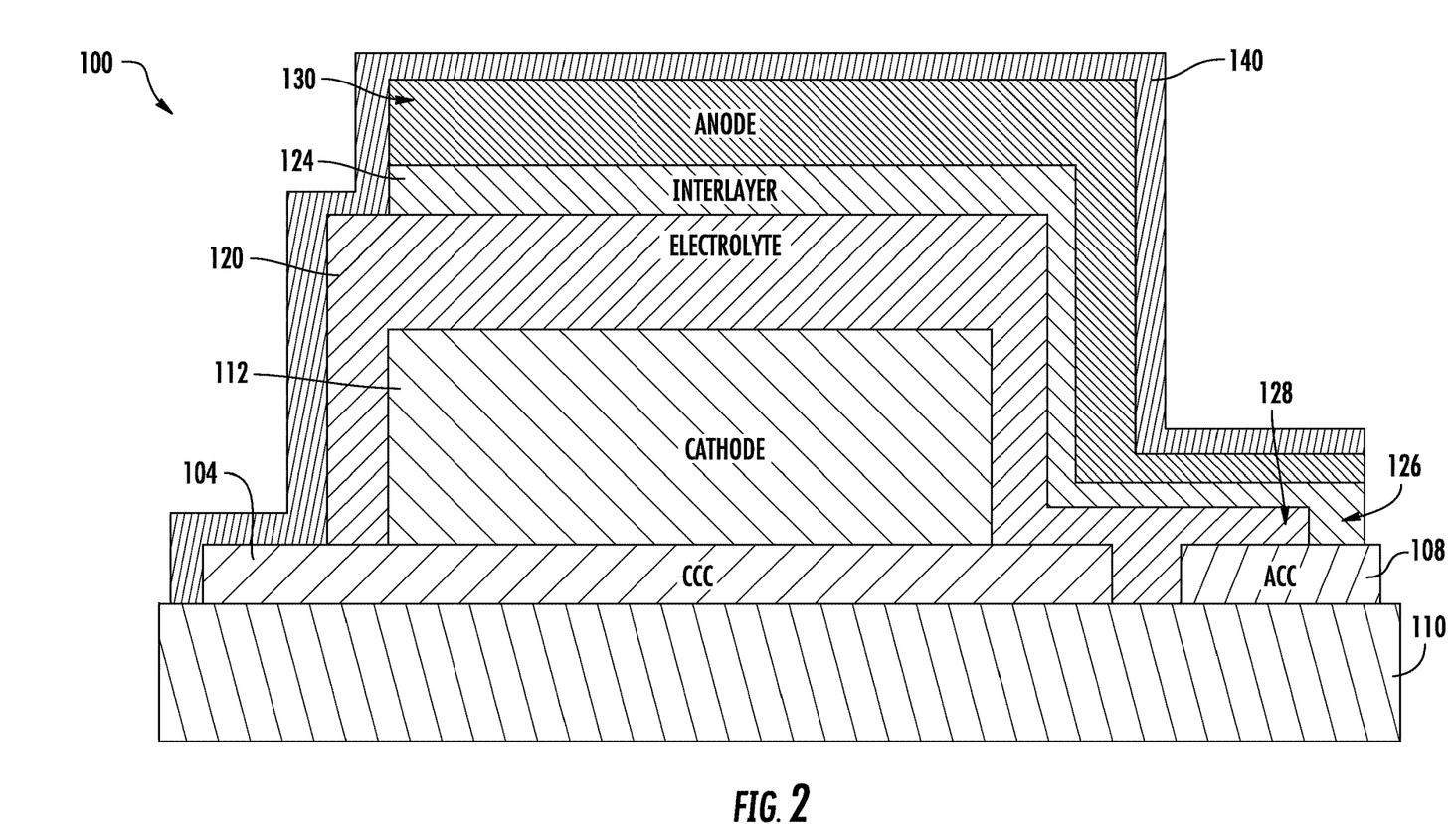
FIG. 2 depicts a side cross-sectional view of a device in accordance with exemplary embodiments of the present disclosure.

Turning now to FIG. 2, the device 100 may further include an encapsulation layer 140 disposed over the anode contact layer 130. As shown, in some embodiments, the encapsulation layer 140 may be provided over all exposed surfaces of the anode contact layer 130, the interlayer 124, the electrolyte layer 120, the cathode current collector 104, and the substrate 110. The encapsulation layer 140 may be a soft and pliable, physical volume accommodating layer capable of accommodating volume changes of the layers of the device 100. In various embodiments, the encapsulation layer 140 may vary its thickness from a first thickness to a second thickness in order to accommodate changes in volume or thickness of different materials in expansion regions. For example, in the case the device 100 is a thin film battery, where the anode contact layer 130 or a portion of the anode contact layer 130 may constitute a selective expansion region, the encapsulation layer 140 may expand or contract in thickness to accommodate the increase or decrease in anode thickness. This results in less stress, less mechanical failure, and better protection of the layers of the device 100.

Figure 3:
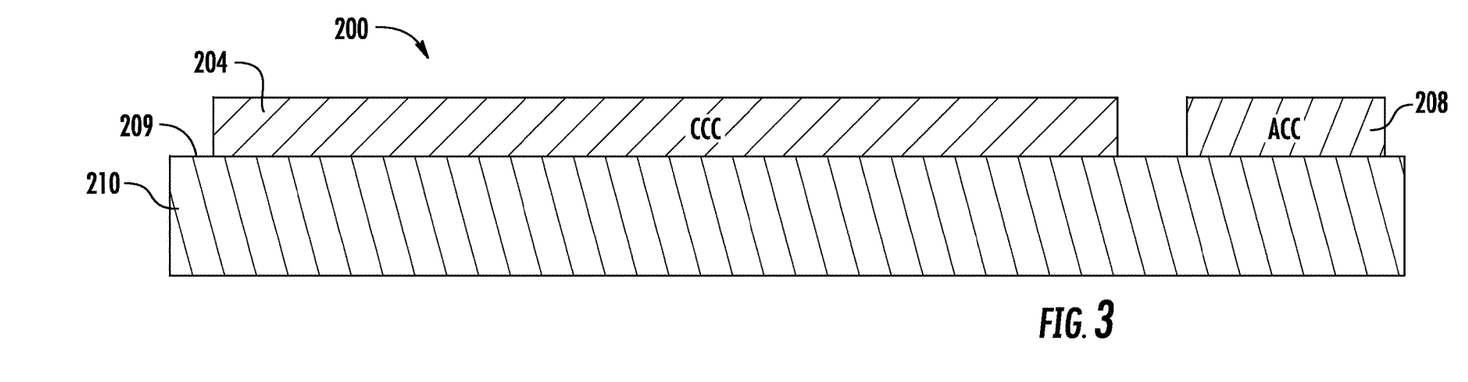
FIG. 3 depicts a side cross-sectional view of a method for forming a cathode current collector and an anode current collector over a substrate in accordance with exemplary embodiments of the present disclosure.

Turning now to FIGS. 3-7 shown are a series of cross-sectional views of a method for forming a device 200 (e.g., a thin film battery) according to various embodiments of the disclosure. FIG. 3 depicts a cathode current collector 204 and an anode current collector 208 formed on a top surface 209 of a substrate 210. In some embodiments, the anode current collector 208 and the cathode current collector 204 are formed on the substrate 210 with an adhesion film (not shown) between the top surface 209 of the substrate 210 and each of the anode current collector 208 and the cathode current collector 204.

Figure 4:
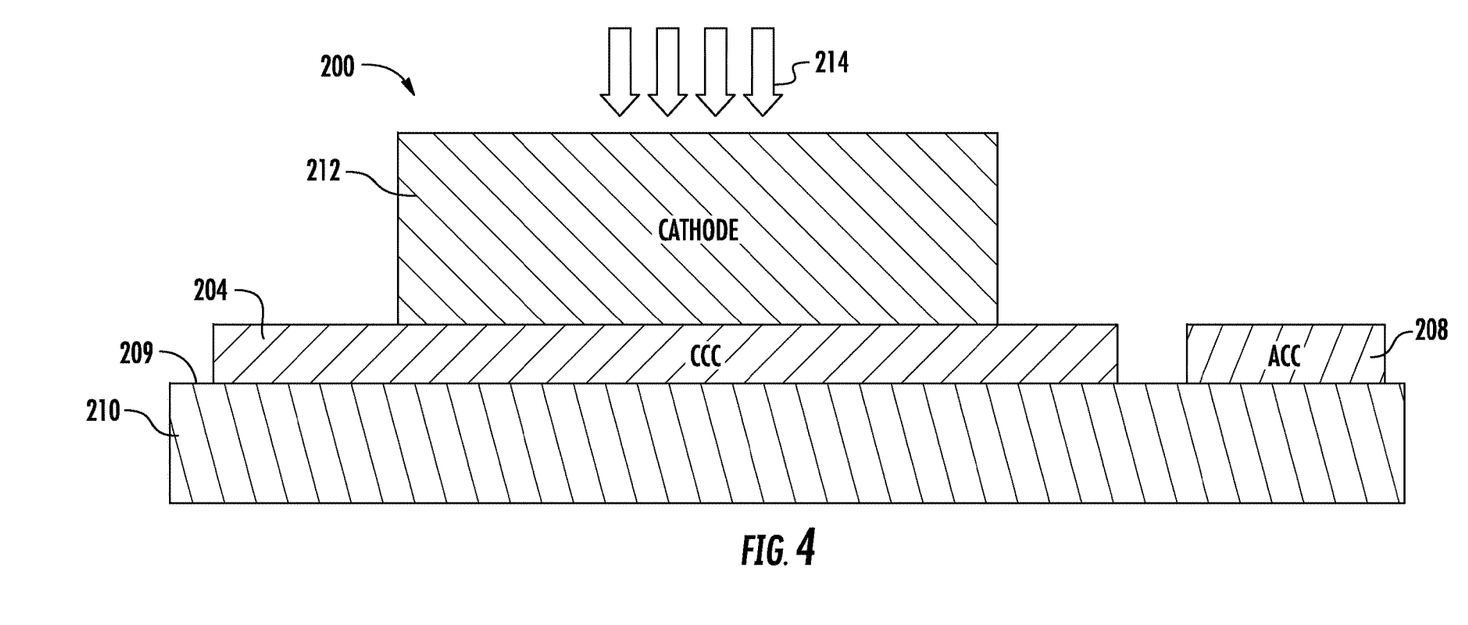
FIG. 4 depicts a side cross-sectional view of a method for forming a cathode over the cathode current collector and the anode current collector in accordance with exemplary embodiments of the present disclosure.
Figure 5:
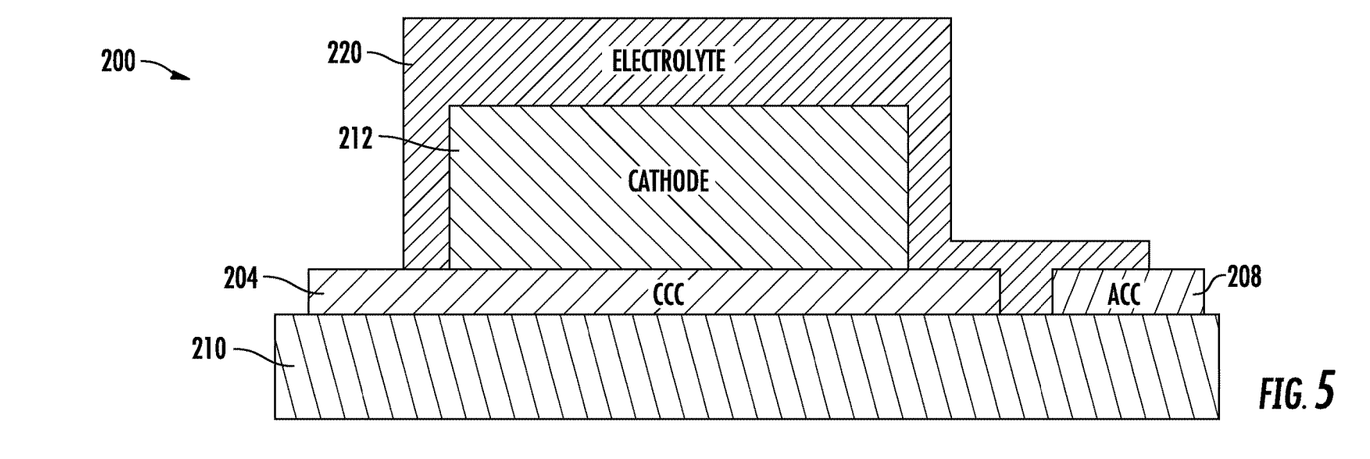
FIG. 5 depicts a side cross-sectional view of a method for forming an electrolyte over the cathode in accordance with exemplary embodiments of the present disclosure.

FIG. 4 depicts a cathode 212 formed atop the cathode current collector 204. In one embodiment, the cathode 212, such as LiCoO2, may be annealed 214 to achieve an intended phase/composition of LCO for good performance of the device 200. For example, an amorphous or microcrystalline film of $LiCoO_2$ may be annealed at approximately 700° C. to obtain a crystalline $LiCoO_2$ cathode film. FIG. 5 depicts an electrolyte layer 220 formed over the cathode 212. As shown, the electrolyte fully encases the cathode 212, and extends along the substrate 210 to partially cover the anode current collector 208.

Figure 6:
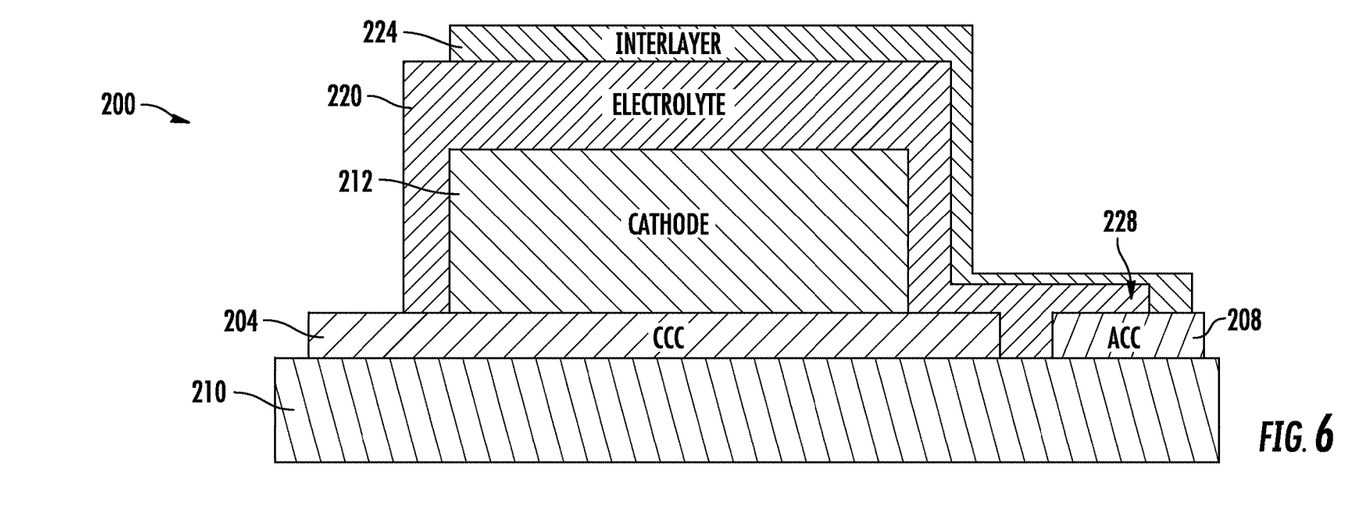
FIG. 6 depicts a side cross-sectional view of a method for forming an interlayer over the electrolyte in accordance with exemplary embodiments of the present disclosure.

As shown in FIG. 6, an interlayer 224 is then formed over the electrolyte layer 220. In some embodiments, the interlayer 224 may be formed by thin film fabrication processes, such as for example, physical or chemical vapor deposition methods (PVD or CVD), oxidation, nitridation or electroplating. As shown, the interlayer 224 partially covers the electrolyte layer 220, and extends along the substrate 210 to wrap around an edge 228 of the electrolyte layer 220. The interlayer 224 may connect directly with the anode current collector 208, as shown.

Figure 7:
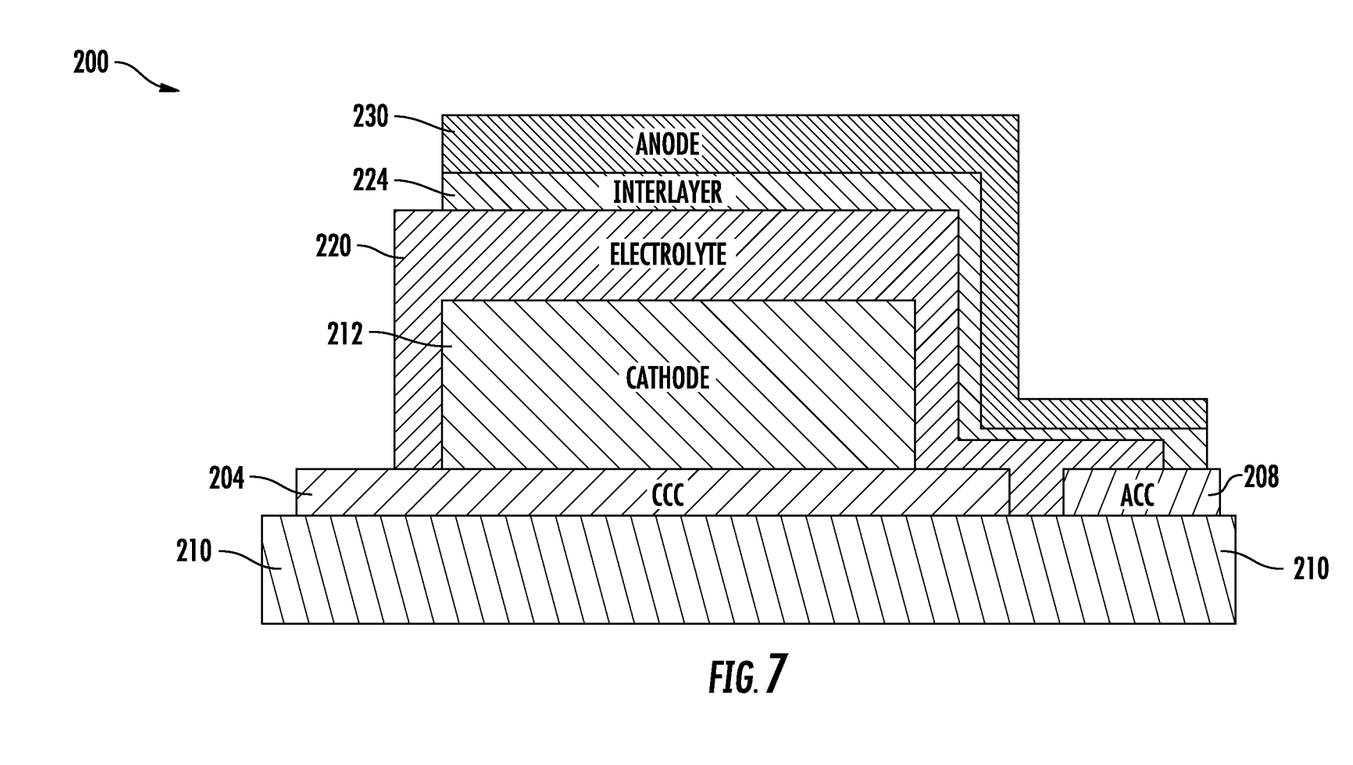
FIG. 7 depicts a side cross-sectional view of a method for forming an anode contact layer over the interlayer in accordance with exemplary embodiments of the present disclosure.

As shown in FIG. 7, an anode contact layer 230 is then formed over the interlayer 224, wherein the anode contact layer 230 may include one or more of an anode and an anode current collector. The anode contact layer 230 extends along and generally conforms to a top surface of the interlayer 224. In some embodiments, the anode contact layer 230 comprises a conductor film, made from, for example, a metal film (e.g., copper) deposited directly on the interlayer 224. In one embodiment, the anode contact layer 230 may also be deposited to overlap a portion of the anode current collector 208. The materials used to fabricate the anode contact layer 230 may be the same or different as the materials used to fabricate the cathode 212. An encapsulation layer may then be formed over the anode contact layer 230, resulting in the structure of the device 100 depicted in FIG. 2.

In view of the foregoing, at least the following advantages are achieved by the embodiments disclosed herein. A first advantage of the disclosure includes the elimination or reduction of stress induced cracking and the resulting device degradations due to the alloying of the Li from the cathode with the interlayer formed between the electrolyte and the anode or anode current collector. A second advantage of the disclosure includes a decrease in overall device impedance from the decrease in electrical contact resistance, leading to device performance improvement. A third advantage of the disclosure includes the versatility to apply the interlayer to all solid state energy devices, wherein reservoir of charge carriers are not present, or the anode materials are not intercalating or readily alloying with the charge carriers, for example when the electrolyte are solid state. A fourth advantage of the disclosure is the accommodation of higher melting compositions with incoming Li in the case an electrochemically active anode layer is deposited atop the interlayer. For example, the increased operational range in temperature caused by the alloy of the electrochemically active anode layer, as opposed to pure Li of the anode current collector, may be mitigated by an adequately thick interlayer.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:
1. A thin film device comprising:
   a cathode current collector and a first anode current collector formed atop a substrate;
   a cathode formed atop the cathode current collector;
   an electrolyte layer formed over the cathode, wherein the electrolyte layer is provided directly atop the cathode current collector and directly atop the first anode current collector;
   an interlayer formed over the electrolyte layer and directly atop a portion of the first anode current collector; and
   at least one of: an anode disposed over the interlayer, and a second anode current collector disposed over the interlayer.
2. The thin film device of claim 1, wherein the anode is an electrochemically active layer.
3. The thin film device of claim 1, further comprising one or more additional interlayers formed over the electrolyte layer.
4. The thin film device of claim 1, further comprising an encapsulation layer formed the anode or the second anode current collector.
5. The thin film device of claim 1, wherein the interlayer is at least one of: silicon, antimony, magnesium, titanium, magnesium lithium, and silver lithium.
6. The thin film device of claim 1, wherein the interlayer is provided directly atop the electrolyte layer.
7. A method of forming a device comprising:
   providing a cathode current collector and a first anode current collector atop a substrate;
   providing a cathode atop the cathode current collector;
   forming an electrolyte layer over the cathode and directly atop a portion of the cathode current collector and directly atop a portion of the first anode current collector;
   forming an interlayer over the electrolyte layer; and
   forming an anode contact layer atop the interlayer.
8. The method of claim 7, the anode contact layer comprising at least one of: an anode, and a second anode current collector.
9. The method of claim 7, further comprising forming an encapsulation layer over the anode contact layer.
10. The method of claim 7, wherein the interlayer is at least one of: silicon, antimony, magnesium, titanium, magnesium lithium, and silver lithium.

* * * * *